(12) United States Patent
Chen (10) Patent No.: US 6,625,077 B2
(45) Date of Patent: Sep. 23, 2003

(54) ASYNCHRONOUS HIDDEN REFRESH OF SEMICONDUCTOR MEMORY

(75) Inventor: Wenliang Chen, Portland, OR (US)

(73) Assignee: Cascade Semiconductor Corporation, Portland, OR (US)

( * ) Notice: Subject to any disclaimer, the term of this patent is extended or adjusted under 35 U.S.C. 154(b) by 0 days.

(21) Appl. No.: 09/976,115

(22) Filed: Oct. 11, 2001

(65) Prior Publication Data

US 2003/0072206 A1 Apr. 17, 2003

(51) Int. Cl.$^7$ ................................................ G11C 7/00
(52) U.S. Cl. ........................................ 365/222; 365/195
(58) Field of Search ................................ 365/222, 195

(56) References Cited

U.S. PATENT DOCUMENTS

| | | | |
|---|---|---|---|
| 5,784,705 A | 7/1998 | Leung | 711/169 |
| 5,970,507 A | 10/1999 | Kato et al. | 711/106 |
| 5,999,474 A | 12/1999 | Leung et al. | 365/222 |
| 6,028,804 A * | 2/2000 | Leung | 365/222 |
| 6,058,451 A | 5/2000 | Bermingham et al. | 711/106 |
| 6,078,547 A | 6/2000 | Leung | 365/233 |
| 6,094,705 A | 7/2000 | Song | 711/106 |
| 6,147,535 A | 11/2000 | Leung | 327/269 |
| 6,222,785 B1 * | 4/2001 | Leung | 365/222 |
| 6,226,709 B1 | 5/2001 | Goodwin et al. | 711/106 |
| 6,259,651 B1 | 7/2001 | Leung | 365/233 |
| 6,282,606 B1 | 8/2001 | Holland | 711/105 |

OTHER PUBLICATIONS

Katayama, Yasunao, "Trends in Semiconductor Memories," *IEEE Micro* (Nov., Dec., 1997).

* cited by examiner

*Primary Examiner*—Vu A. Le
(74) *Attorney, Agent, or Firm*—Stoel Rives LLP (57) ABSTRACT

Improved semiconductor integrated circuit random access memory (RAM) features pin-compatible replacement of SRAM devices, while providing low power and high density characteristics of DRAM devices. The refresh operations of a DRAM array are hidden so as to faithfully emulate an SRAM-type interface. The new refresh strategy is based on prohibiting the start of a refresh operation during certain periods but otherwise continuously refreshing the array, rather than affirmatively scheduling refresh at certain times as in the prior art. Short refresh operations are initiated frequently, driven by an internal clock that generates periodic refresh requests, except when a read or write operation is actually accessing the memory array. By isolating the DRAM memory array from I/O structures, external memory accesses are essentially interleaved with refresh operations, rather than temporally segregating them as in prior art.

17 Claims, 10 Drawing Sheets

Invalid READ, termination during "dataout"

Invalid READ, termination during "access"

Prior art: READ and WRITE cycles

READ access cycle = T + D.

WRITE access cycle = D + T.

Invalid READ, termination during "dataout"

FIG. 3A

Invalid READ, termination during "access"

FIG. 3B

Invalid READ, termination during "refresh"

FIG. 3C

READ access following a WRITE:

FIG. 4A

Low frequency READ, refresh operation can be inserted between "access" and "dataout"

"FETPG"

Falling edge triggered pulse generator. Falling edge of input triggers a high going pulse of duration T.

Timing diagram for a normal read access

FIG. 9

Timing diagram for an invalid read operation terminated within T of starting.

FIG. 10

Timing diagram for an invalid read operation terminated within 2*T of starting.

FIG. 11

Timing diagram of a write cycle.  FIG. 12

Timing diagram of a write cycle immediately followed by a read.

FIG. 13

ASYNCHRONOUS HIDDEN REFRESH OF SEMICONDUCTOR MEMORY

TECHNICAL FIELD

This invention is in the field of semiconductor integrated circuit random access memory devices and, more specifically, is directed to "hiding" refresh operations of a DRAM array to faithfully emulate an SRAM-type interface.

BACKGROUND OF THE INVENTION

In an asynchronous SRAM, there are generally three modes of operation: read, write, and standby. In read mode, a change of input address signals the start of a read operation. Sufficient time, referred to as "read cycle time," must be allowed after the change of address for the read operation to complete. If the time allowed is less than the minimum read cycle time, the read operation is aborted, known as an invalid read. The consequences of an invalid read are that the output data is invalid, but the content of the memory is unaffected. Write operations are triggered by the assertion (typically active low) of external signals W# (write-complement or "write-bar") or CS# (chip select-complement or "CS-bar"). Write operations that last for less than a predetermined "write cycle time" are not allowed.

Accessing and refreshing DRAM arrays is a different matter. Unlike SRAM cells, reading of a DRAM cell is destructive, as it discharges the selected storage capacitors. After each read operation, therefore, the sensing amplifier has to write the data back to the cell to restore the cell content. Every read operation must be completed in this fashion or else cell contents will be lost. In contrast, an SRAM read operation can be aborted at any time without destroying cell content.

DRAM cells also need to be refreshed periodically due to storage cell leakage. A refresh operation is a dummy read operation, where the cell is read and its data written back. If a cell is not refreshed for a specified period of time (refresh interval), it will lose its data content. A typical refresh interval at this writing is on the order of 64 milliseconds. Static RAM (SRAM) has no refresh requirement but is relatively large (less dense) and consumes more power than DRAM per bit.

Various DRAM and SRAM designs are known in the art. A number of attempts have been made to make DRAM appear to work like SRAM, but these efforts have been only partially successful. One example is disclosed in Leung et al. U.S. Pat. No. 5,999,474 for "Method and apparatus for complete hiding of the refresh of a semiconductor memory." The apparatus includes a multi-bank DRAM memory and an SRAM cache that stores the most recently accessed data. Each access is stored in the SRAM cache. When there is a cache hit, the DRAM bank is not accessed, allowing time for the DRAM bank to be refreshed. The size of the SRAM cache is determined to guarantee sufficient refresh rate. This method, however, due to its complexity, can only be implemented in a synchronous design, where an external clock is present. It would be extremely difficult or impossible to implement this method in asynchronous design.

"UtRAM" (Unit transistor RAM) is produced by Samsung Electronics Co., Ltd. The product datasheet (part # K5Q6432YCM-T010) indicates that it uses a DRAM memory core, with refresh hidden from the external interface. The interface is similar to that of an asynchronous SRAM, but still clearly incompatible with asynchronous SRAM. The datasheet documents two flaws that make it incompatible with SRAM, namely:

1. When invalid read operations occur continuously, the internal refresh operations cannot be performed, resulting in data loss.
2. When write operations occur continuously, the internal refresh operations cannot be performed, resulting in data loss.

The implementation details of "UtRAM" have not been disclosed publicly. In any event, the product does not completely "hide" refresh from the external interface as noted above. In other words, Samsung UtRAM imposes timing restrictions on the external interface beyond the usual SRAM requirements. Consequently, the UtRAM and similar products cannot provide a fully pin-compatible substitute in an SRAM-interface application.

Fujitsu offers a product called "FCRAM" (Fast-Cycle RAM)—a pipelined DRAM core design. Its interface resembles that of asynchronous SRAM. However, it appears from the published datasheet that FCRAM operates differently from asynchronous SRAM. For example, an asynchronous SRAM can start a read cycle with an address change. FCRAM, however, requires explicitly triggering each read cycle with CS# or OE signals. FCRAM also imposes timing requirements for write operations that differ significantly from those of conventional asynchronous SRAM.

Thus, the need remains for a memory device that completely hides refresh operations, and provides a pin-compatible substitute for conventional SRAM along with improved density and lower power requirements.

SUMMARY OF THE INVENTION

The present invention includes improved methods, circuits and products that are especially useful to implement pin-compatible substitutes for conventional SRAM. One aspect of the invention is a novel refresh strategy that is completely hidden from the user interface; it imposes no special restrictions on access timing and the like. Rather, a semiconductor memory product that implements the new refresh strategy can be made to present an external interface that behaves just like conventional (asynchronous) SRAM. The user (or systems in which such a memory is deployed) can ignore refresh entirely; it is invisible. However, because the improved memory products leverage DRAM memory cells internally, they provide substantially greater density, and lower power consumption, than SRAM products.

The new refresh method is based on prohibiting the start of a refresh operation during certain periods (i.e., under certain conditions), but otherwise continuously refreshing the array, rather than affirmatively scheduling refresh at certain times as in the prior art. In particular, refresh operations are ongoing continuously, driven by an internal clock that generates periodic refresh requests, except during specific periods when a read or write operation is actually accessing the memory array. In other words, the new scheme executes a refresh at any time (i.e., whenever requested by a refresh generator), except during selected periods when the start of a refresh operation is prohibited. In this regard the refresh operates asynchronously. More specifically, according to the present invention, a period or "time slot" in which to complete a pending refresh operation is inserted within every read and every write cycle. In prior art, refresh is scheduled during periods when read and write accesses are prohibited. Thus, the present invention is characterized by essentially interleaving (external) memory accesses and refresh operations, rather than temporally segregating them as in prior art. This feature has the benefit of alleviating interface restrictions that characterize the prior art such as those described above.

According to another aspect of the invention, a single refresh operation refreshes only a limited number of rows of the memory array, specifically one row in a presently preferred embodiment, whereas the prior art "auto refresh" cycle refreshes the entire array. The new, one-row refresh is fast; time to complete an individual row refresh is inserted during every access by "stretching" the read or write cycle. (A particular time slot may not actually be used to complete a refresh—as further explained later—but it is made available.) Note that a time to complete the pending refresh is provided because, as alluded to above, a refresh starts to execute immediately upon request, except during certain "refresh start prohibited" periods. The start of a refresh operation is prohibited only when a pending read/write array access must be completed. Otherwise, a refresh operation generally begins when initiated by the refresh circuit, and time to complete the refresh is always available by virtue of the "stretched" read and write cycles.

Another aspect of the invention calls for isolating the internal memory array from die data input/output (I/O) structures such as buffers and pins. In one presently preferred embodiment, this isolation is implemented using a latch (or latching register) between the sense amplifiers and the I/O structures. This enables segregating the array access (or simply "access") time from the data I/O portions of a memory operation. A data input (sometimes called "datain") operation or a data output operation (dataout), preceding a data write access or following a data read access, respectively, does not interfere with completion of a refresh access operation once the I/O structures are segregated from the array.

The method provided by this invention can be implemented asynchronously. As a result, a low-power asynchronous SRAM substitute device can be built using DRAM cells. Asynchronous SRAM, compared to its synchronous counterpart, consumes much lower power because it does not need a clock. DRAM cells provide power savings as well, and vastly higher density over SRAM.

Additional objects and advantages of this invention will be apparent from the following detailed description of preferred embodiments thereof which proceeds with reference to the accompanying drawings.

DETAILED DESCRIPTION OF PREFERRED EMBODIMENT

Preliminarily, the present invention includes the following key characteristics, which may be considered as more detail is described below:

1. Refresh operations are completed within read and write cycles, as well as during an idle state. A portion of each read or write cycle is allocated for completion of a refresh operation.

2. Refresh operations are triggered by an internal refresh generator circuit. A ring oscillator or the like periodically generates refresh requests. Each refresh request includes the address of a row to be refreshed.

3. Each refresh request is queued until an access arbiter signals permission to start a refresh with an "ok2ref" (okay to start refresh) signal.

4. The access arbiter examines external accesses and determines when it is okay to start a refresh. Essentially, the arbiter prohibits refresh during external access operations. But by isolating the array from the I/O structures, refresh can proceed during I/O times. The access arbiter also sequences read and write operations such that they do not conflict with refresh operations and each other. The access arbiter also guarantees that each array access operation is completed once it is started. This method allows the construction of true asynchronous SRAM using DRAM cells by completely hiding DRAM refresh operations under any operating conditions.

Figure 1A:
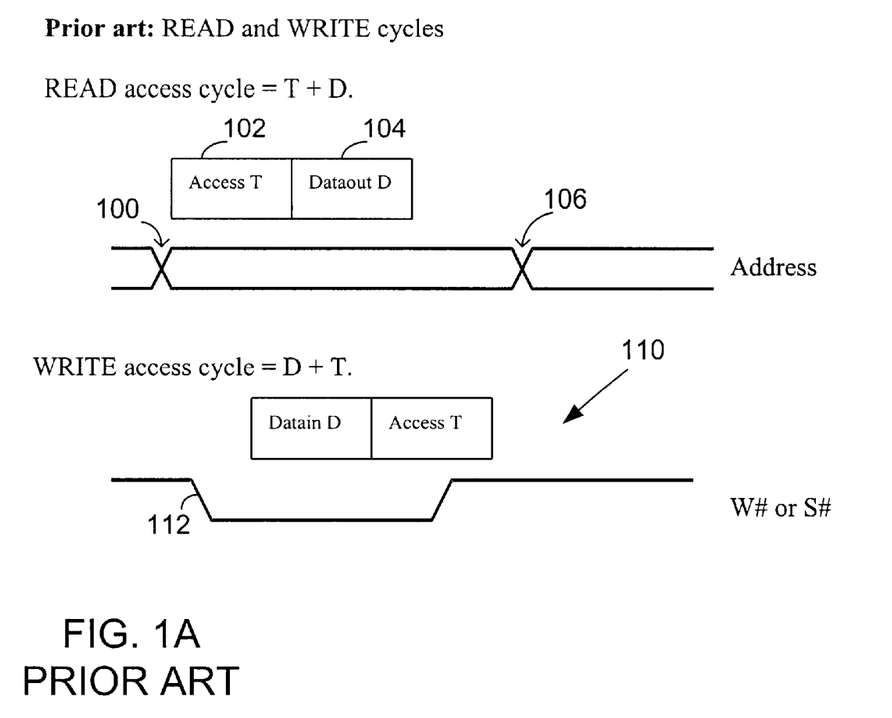
FIG. 1A is a timing diagram illustrating prior art READ and WRITE memory access cycles.
Figure 1B:
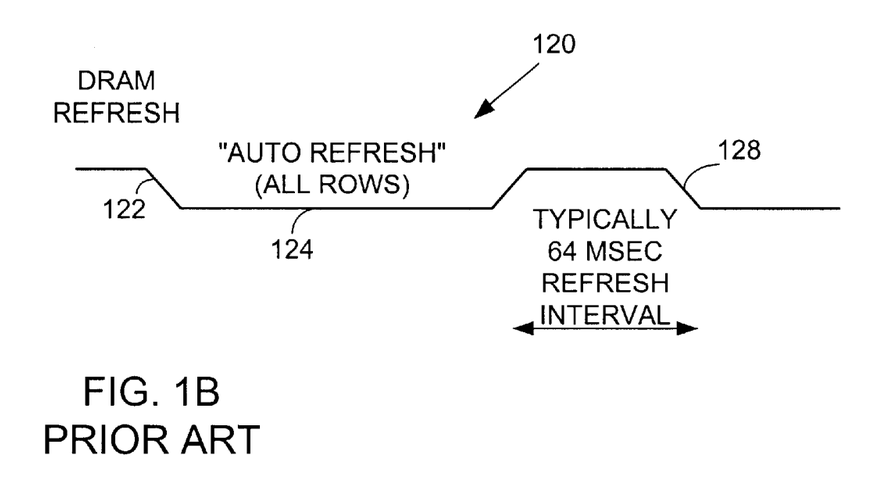
FIG. 1B is a timing diagram illustrating a prior art auto refresh signal.

We begin with a brief review of basic READ/WRITE timing in an asynchronous memory device in accordance with prior art. A typical memory read access cycle consists of two parts—first reading the array, say for a duration of T, and then sending the read data to chip outputs, say for a duration of D. The total read access time (starting at address transition) therefore is T+D. This timing is illustrated in FIG. 1A where the read cycle begins with the address transition 100, access time T is shown at 102 and data output time D is shown at 104. A new operation can begin at the second address transition 106. Conversely, a WRITE access cycle is shown at 110, beginning in response to a write-bar (W#) or select-bar (S#) signal as is known. The time (datain) for receiving data from the chip inputs, D, is followed by an array access (write) time T. The write cycle duration is D+T. FIG. 1B illustrates a prior art auto refresh signal 120. The refresh signal (active low) is asserted at edge 122 and remains asserted for a period 124 during which all rows in the memory are refreshed. The next refresh occurs within a specified maximum refresh interval, typically around 64 msec for products presently available such as a four megabit DRAM.

One key aspect of the present invention calls for expanding the memory access time to 2T+D. The additional period or "time slot" T is allocated for completion of a pending refresh operation (in case one is in progress—there may be none). A refresh operation takes about the same amount of time as a read access, T. A refresh begins whenever requested, except during certain prohibited times, and adequate time to ensure completion of a refresh operation is allocated within external access cycles. Even continuous read operations at full speed do not interfere with timely refresh as will be shown below.

Figure 2A:
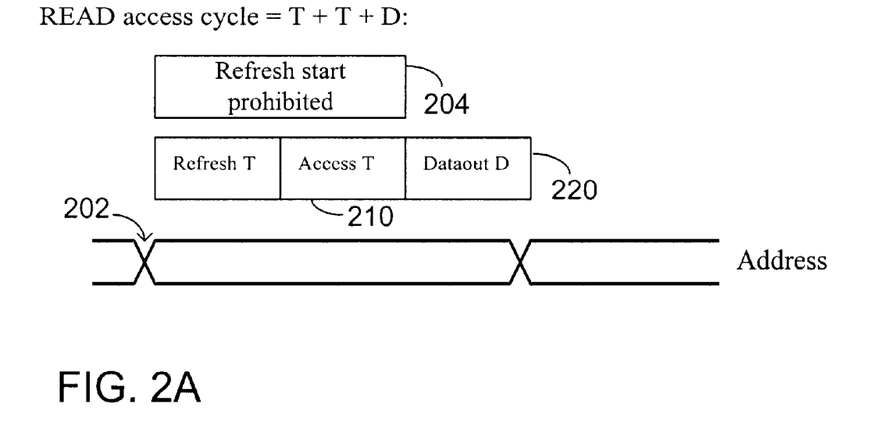
FIG. 2A is a timing diagram illustrating a read access cycle in accordance with the present invention to support asynchronous [interlaced] refresh operations.

FIG. 2A is a timing diagram illustrating a read access cycle according to the present invention. The cycle begins at an address transition 202. By the term "access cycle" we mean an array access and an associated data-out operation (or data-in operation in the case of a write access cycle). Here, the total read access cycle time is expanded to D+2T. The array access portion is extended to 2 times T, while the data-out portion remains D. The additional time slot T is allocated to ensure that a refresh operation started before this read access cycle begins (202) will have sufficient time to complete. A refresh operation cannot begin during the period 204 "refresh start prohibited" as further explained later. The time slot "T" is configured to be the longest of the array read time, refresh time, and write time, and D 220 is set to the longer of data output path time and data input path time. This ensures that a pending refresh will complete as described.

In read and write cycles, "data-in" and "data-out" are performed outside the array. Therefore refresh can be performed in parallel with "datain" or "dataout." However, refresh operation cannot overlap read or write "access" because they are both performed inside the array. As a result, a refresh operation is free to start any time except for "refresh" and "access" time slots, as indicated in the figure.

Figure 2B:
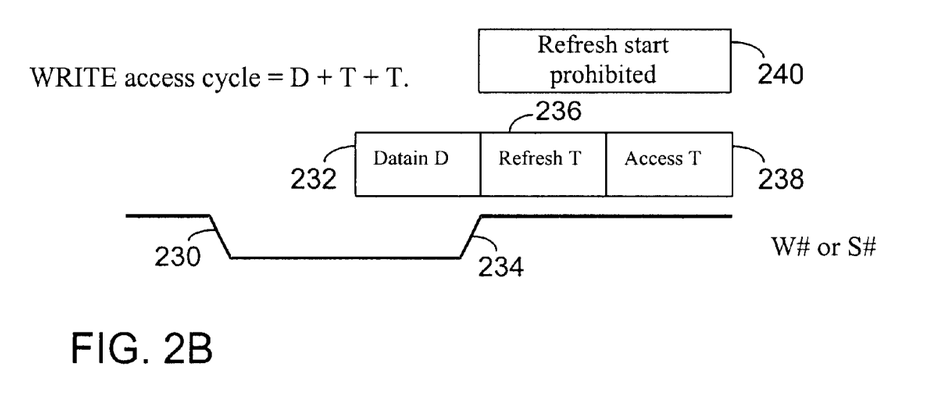
FIG. 2B is a timing diagram illustrating a WRITE access cycle in accordance with the present invention to support asynchronous [interlaced] refresh operations.

FIG. 2B is a timing diagram illustrating a write access cycle according to the present invention. Preliminarily, the write control signal (W#) or select signal (S#) (or both) are asserted, typically active-low, as shown at falling edge 230. The write data are held stable for a data-in period D, 232, for the data to traverse the input circuits, column selection, and latch in the sense amps for driving the selected bit lines. This data-in period ends at edge 234 whereupon the array access period begins. Here, an extra time slot 236 in inserted before the usual array access time 238. Refresh start is prohibited, i.e., a refresh operation is not permitted to begin during the time indicated at 240, consisting of the extra time slot 236 plus the usual array access time 238. The extra time slot 236 ensures sufficient time for a pending refresh operation—one that began before edge 234—to complete before the write data is written into the array cells.

Figure 3A:
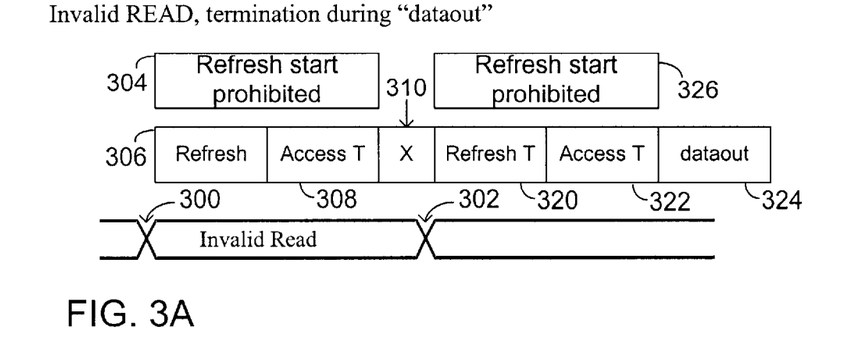
FIG. 3A is a timing diagram illustrating memory system operation in accordance with the present invention in the case of an invalid READ operation terminated during the data output ("dataout") period.
Figure 6:
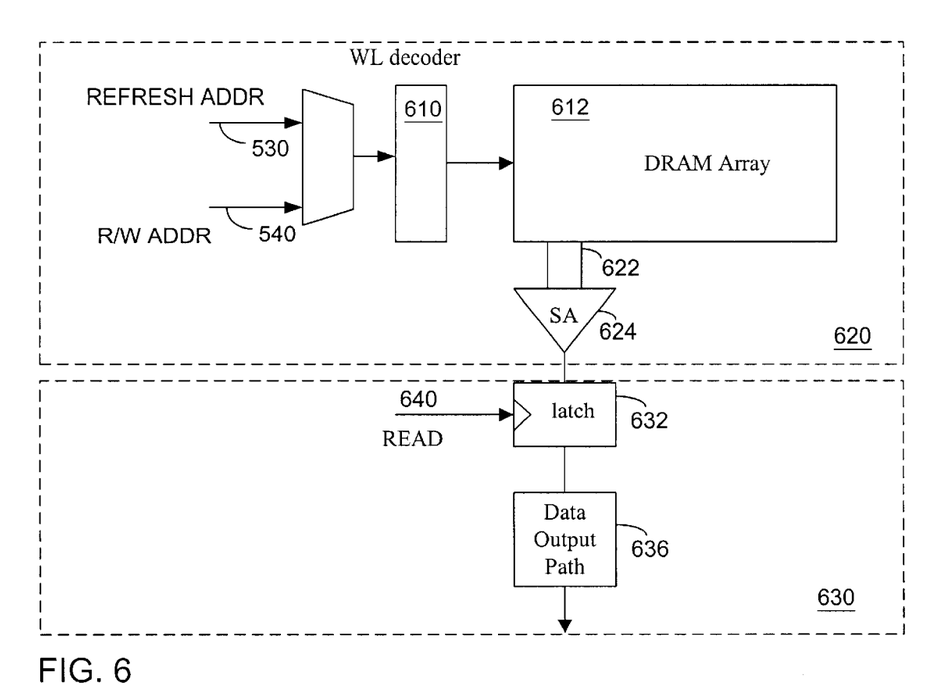
FIG. 6 is a simplified block diagram of a portion of the memory system of FIG. 5 illustrating isolation of the data input/output path from the array.

FIG. 3A is a timing diagram illustrating a memory system operation in the case of an invalid READ operation terminated during the data output period. The goal is to ensure that data stored in the array is not corrupted, and still allow refresh operations to proceed. In FIG. 3A, a read operation begins with the address transition 300. At that point, a "refresh start prohibited" period 304 begins. An extra time slot 306 is inserted, as described above, to ensure sufficient time for a pending refresh operation to complete before the present read cycle is allowed access to the array. That time slot 306 is followed by the usual array access time slot 308. As illustrated in the figure, refresh start is prohibited during the period consisting of 306 plus 308. Normally, the data out operation would follow the access time slot 308. In this case, the read operation was terminated prematurely by a new address transition 302. This abbreviated data time slot 310 presumably was not long enough to complete the read cycle in accordance with applicable specifications. However, as described above, the present method calls for isolating the memory array from the data I/O structures and, during a read access cycle, storing the sensed data, for example in a latch circuit as illustrated in FIG. 6. Accordingly, referring again to FIG. 3A, the read data that was sensed during the array access time slot 308 has been stored by the time the new read cycle begins at 302. At time 302, a new read cycle is initiated as before. This cycle consists of the extra time slot 320 followed by the usual array access time slot 322 followed by the usual data out time slot 324. As before, refresh start is prohibited during the first two of these time slots, as illustrated at 326. Note that if a refresh request was pending, it would be permitted to begin during the time slot 310 and it would be assured adequate time to complete array access during the time slot 320.

Figure 3B:
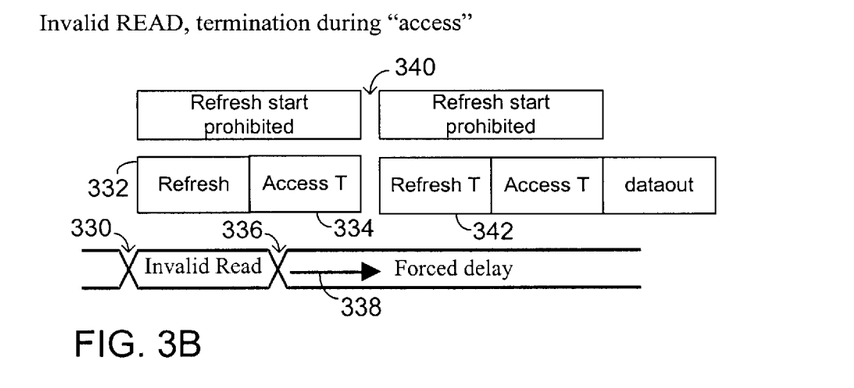
FIG. 3B is a timing diagram illustrating memory system operation in accordance with the present invention in the case of an invalid READ operation terminated during the array access period.

FIG. 3B is a timing diagram illustrating operation of the memory system in the case of a read access cycle that is terminated during the array access time slot. In FIG. 3B, a read operation begins at the address transition 330. As before, an extra time slot 332 is inserted, effectively deferring access to the array for a time slot T. Access to the array, time slot T follows at 334. However, the read access cycle is prematurely terminated by a new address transition 336. The access that began at 334 must be allowed to complete so that data is not corrupted. Accordingly, a forced delay 338 prohibits the start of a new read access cycle until after the access time slot 334 is concluded. Time slot 340 provides a window in which a refresh operation can begin. Such a refresh operation would have time to complete during the inserted time slot 342.

Figure 3C:
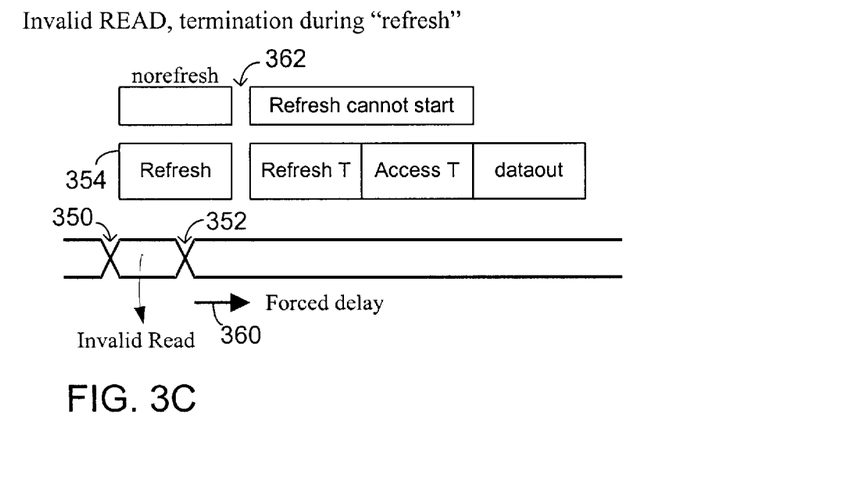
FIG. 3C is a timing diagram illustrating memory system operation in accordance with the present invention in the case of an invalid READ operation terminated during a refresh period.

Referring next to FIG. 3C, this timing diagram illustrates a read access cycle that is terminated during a refresh operation. The read access cycle begins at the address transition 350 but it is terminated prematurely be a second address transition 352, during the course of a refresh operation 354. In this scenario, the memory controller circuitry (described below) effectively forces a delay period indicated by the arrow 360 beginning at the second address transition 352. This delay prevents the start of a new access cycle until the pending refresh operation has time to complete, i.e., the conclusion of time slot 354, plus an additional window 362 which would allow a new refresh operation to begin if one is pending. A new read (or write) access cycle can begin at any time after the forced delay 360 is concluded. To summarize, FIGS. 3A, 3B and 3C illustrate operation in accordance with the present invention for each of the three possible invalid read conditions. In each case, data integrity is preserved and refresh operations are executed well within the necessary time constraints.

Figure 4A:
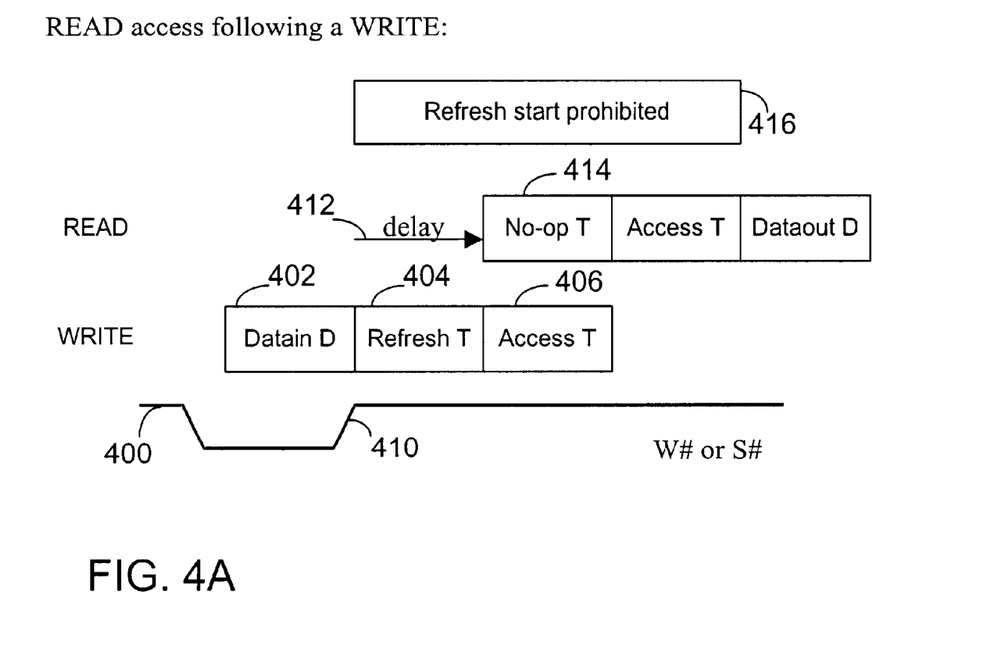
FIG. 4A is a timing diagram illustrating memory system operation in accordance with the present invention in the case of a READ access following a WRITE operation.

Next we consider a read cycle following a write cycle. Referring to FIG. 4A, the W# or S# control signal is shown at 400. The write operation comprises the datain time slot 402 followed by a refresh time slot 404 and the array access time slot 406 as described previously. In this figure, the rising edge 410 of the control signal 400 signifies the end of the write cycle and the beginning of a read cycle. In this case, access to the array must be delayed as indicated by arrow 412 in order for a pending refresh to complete 404. Thus time slot 414 is unused with respect to the read operation (no-op), as the write operation is accessing the array at that time. The read access immediately follows 414. Note that refresh start is prohibited 416 throughout this time.

Figure 4B:
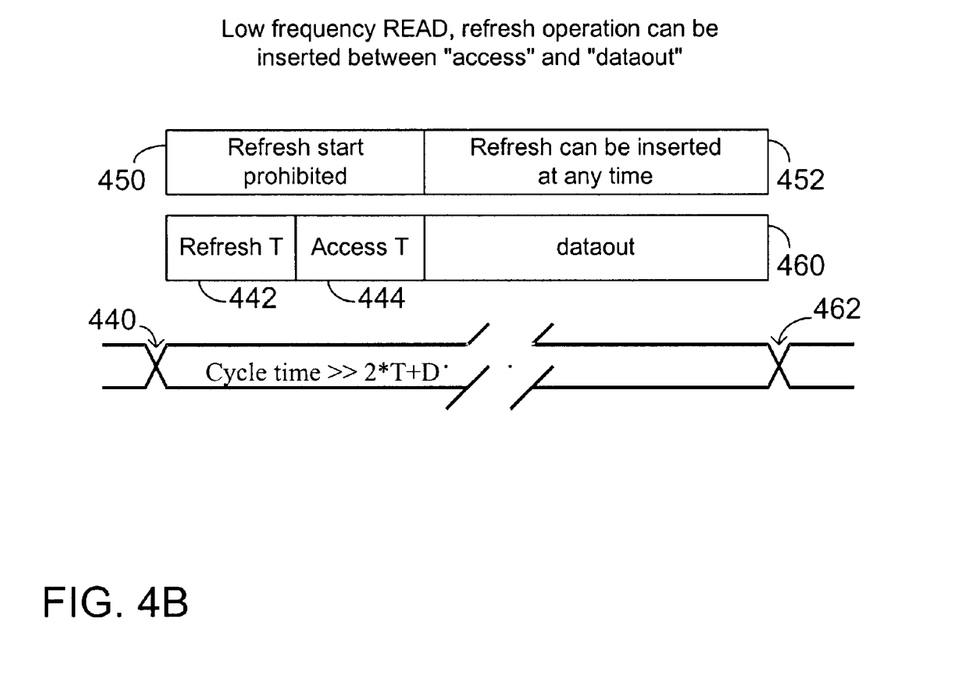
FIG. 4B is a timing diagram illustrating memory system operation in accordance with the present invention in the case of a low frequency READ cycle.

FIG. 4B illustrates operation of a low frequency read cycle. By "low frequency" we mean the cycle time is much longer than two times T+D. The read cycle begins as usual with an address transition 440. At the beginning of the cycle, the refresh time slot 442 is inserted before the usual access time slot 444, as above. Further, the refresh start is prohibited during this time as illustrated at 450. After the access time slot 444 is concluded, the refresh start prohibited period 450 also is concluded, so that a refresh can begin at any time thereafter, as shown at 452. So whenever the refresh generator circuit (discussed below with reference to FIG. 5) requests a refresh, it will begin immediately. Note that the read data resulting from the access 444 is latched, as described above, so that it remains stable throughout the data out period 460 and is not disturbed by a subsequent refresh access to the array.

Additional refreshes will be executed as necessary until a new access cycle begins at the address transition 462.

Figure 5:
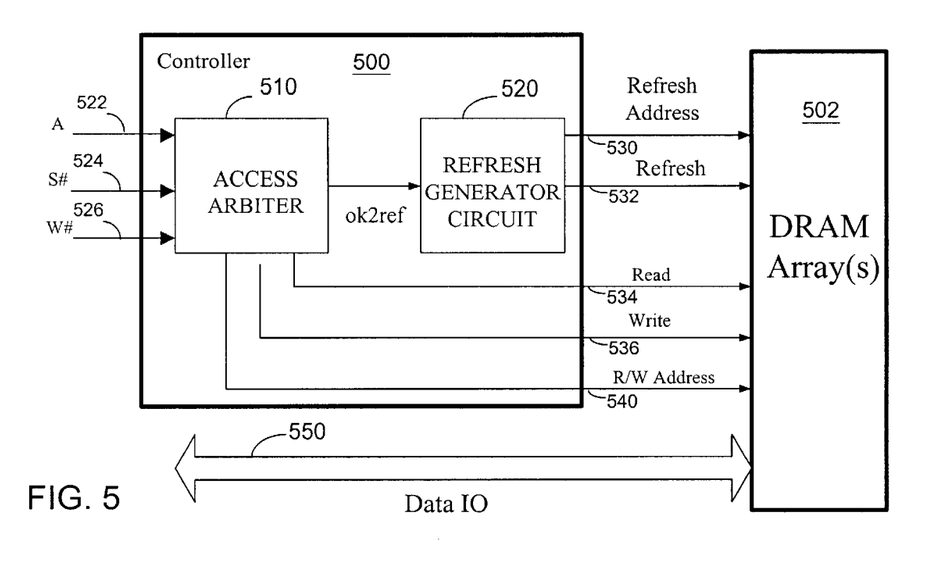
FIG. 5 is a simplified block diagram of a hidden-refresh memory system according to the present invention.

FIG. 5 is a simplified block diagram of a hidden-refresh memory system according to the present invention. The memory system, which preferably would be implemented in a single integrated circuit product, comprises a controller 500 and one or more DRAM arrays 502. Controller 500 comprises an access arbiter 510 and a refresh generator circuit 520. Essentially, the controller block is added between the external pins and the DRAM array as compared to a conventional memory. The external pins pertinent here include the address bus 522, the chip select bar 524 and write bar 526. The address bus 522 in general will include a parality of parallel signal lines as is well known. These external pins provide a standards SRAM interface so that the memory system described herein can be substituted for a conventional SRAM in virtually any application. The controller 500 generates a refresh address on a refresh address bus 530 refresh controller signal 532 read and write control signal 534, 536 respectively and a read/write address on R/W address bus 540. The data input/output path 550 does not impact the controller circuitry 500. The controller circuitry is described in greater detail below.

FIG. 6 is a simplified block diagram of a portion of the memory system of FIG. 5 illustrating isolation of the data input/output path from the DRAM array. In the controller 500, the refresh generator circuit 520 generates internal refresh requests periodically, which are queued until released in response to a control signal from the access arbiter 510. The access arbiter examines the external inputs just described and determines appropriate scheduling of refresh operations. These features are described in greater detail in the circuitry and timing diagrams described below.

In FIG. 6, the refresh address 530 and the read/write address 540 are inputs to a multiplexor 600. The selected address is input to a word line decoder circuit 610 which in turn asserts the selected row or word line in the DRAM array 612 in the conventional fashion. In FIG. 6, the upper portion 620, delineated by a dashed line, identifies the array access portion of the memory system, while the lower portion, delineated by a separate dashed box 630, identifies the data input/output ("IO") structures. In the array access portion 620 bit lines 622 are coupled to sense amplifiers 624 in the conventional manner. The present invention can be applied to various DRAM array configurations, including without limitation open bit lines, folded bit lines, folded and shared bit lines, and interleaved designs. The invention can also be used with twisted bit line structures and virtually any other DRAM design as the present invention requires no modifications in connection with the array and sense amps per se.

In the lower portion of FIG. 6, the data IO structure 630 is modified from the conventional design by the addition of a latch 632. Although only a single latch is illustrated here for simplicity, a latch or similar storage means for retaining the data provided by the sense amps would be provided for each bit or sense amp output. Such storage means could include any sort of latch, register, flip flop circuit or the like. It could be a FIFO or even SRAM. As explained above, its function is to retain the sense amp output data and hold it available to the data output path 636 so that it is not affected by a subsequent access to the DRAM array 612. The data output path 636 generally would include column decoding and selection and IO drivers and buffers ultimately coupled to the data IO pads. Some of these IO structures may be modified or absent in an embedded application or SOC device where the memory data lines need not be exposed externally. The latch 632 is controlled by the read signal 640 so that the latch is opened for a "flow through" mode only during a read access operation. After a read access operation is completed, the sensed data is stored in the latch 632 by assertion of the read control signal 640. Subsequent memory array access operations can then occur without disturbing the data stored in the latch.

Figure 7A:
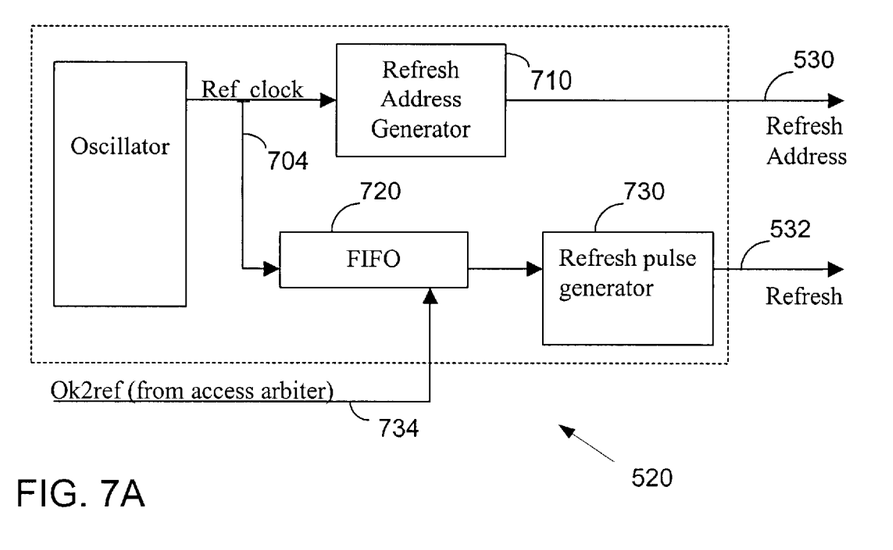
FIG. 7A is a simplified block diagram of the refresh generator circuit of the memory system of FIG. 5.

FIG. 7A is a simplified block diagram showing an example of a refresh generator circuit (520 in FIG. 5). The refresh generator circuit generally comprises an oscillator 702, a refresh address generator 710, a FIFO memory 720, and a refresh pulse generator 730. The oscillator 702 can be implemented in a variety of ways which are known to electrical engineers, such as a ring oscillator circuit. For most applications the ocelots circuit should be chosen to provide low power consumption. Ocelots 702 generates the reference clock signal at 704. This internal clock signal has an oscillation period corresponding to the DRAM array refresh internal. The reference clock signal 704 gates the refresh address generator 710 which, in turn, increments through the row address space. Its output is the refresh row address 530 mentioned above. Column address is unnecessary for the refresh generator circuitry because every column is refreshed in each refresh operation.

The FIFO buffer 720 generates and stores a refresh request as follows. The FIFO is written in response to the refresh clock signal 704. For example, each cycle of the refresh clock 704 would write a "1" bit into the FIFO. The output of the FIFO triggers the refresh pulse generator 730 to generate a refresh pulse, corresponding to the refresh control signal 532. The FIFO buffer 720 is read in response to the ok2ref 734 which is generated by the access arbiter (510 in FIG. 5). In other words, each assertion of the ok2ref signal 734 clocks a bit out of the FIFO 720 to the refresh pulse generator 730. Typically, only one bit needs to be buffered in the FIFO 720, so it could be implemented in various ways like a flip flop circuit.

Figure 7B:
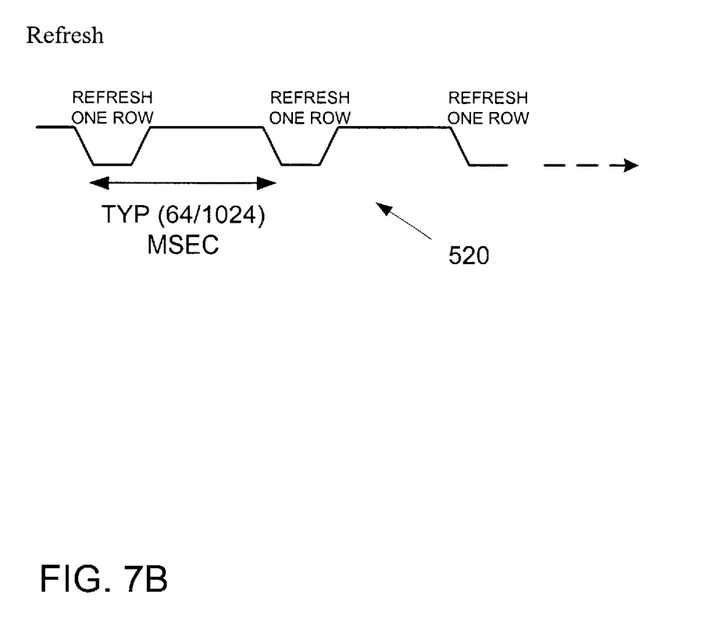
FIG. 7B is a timing diagram illustrating refresh pulse signals provided by the refresh generator of FIG. 7A in various scenarios.

FIG. 7B is a timing diagram illustrating the refresh control signal 532 provided by the refresh pulse generator 730. In FIG. 7B, the refresh control signal 520 has a period not to exceed the array refresh interval, for example 64 milliseconds, divided by the number of rows in the array. This is to ensure that every row is refreshed at least as often as the refresh interval.

Figure 8:
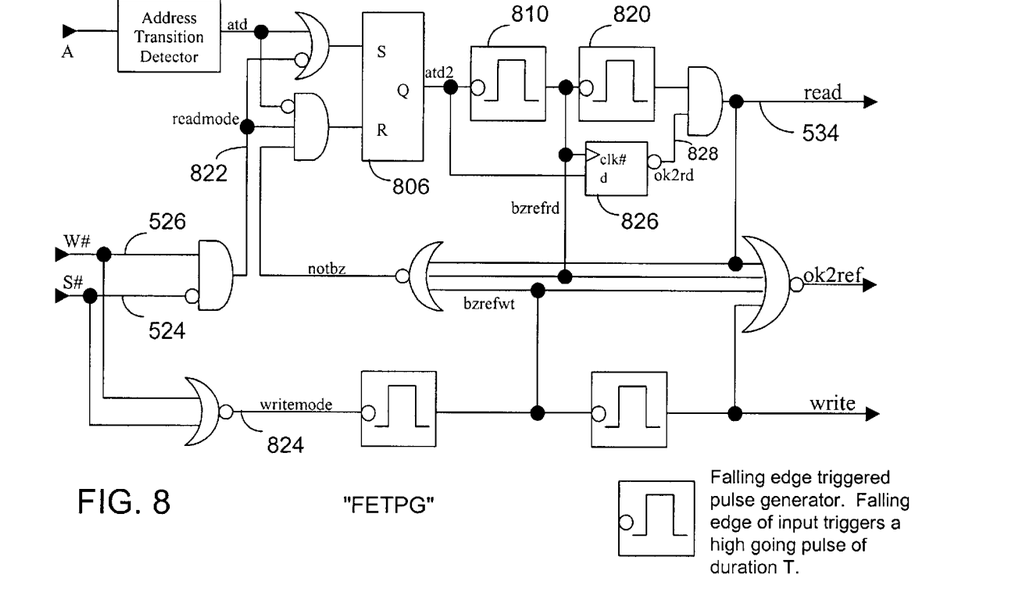
FIG. 8 is a schematic diagram of one illustrative implementation of the access arbiter circuit of FIG. 5.
Figure 9:
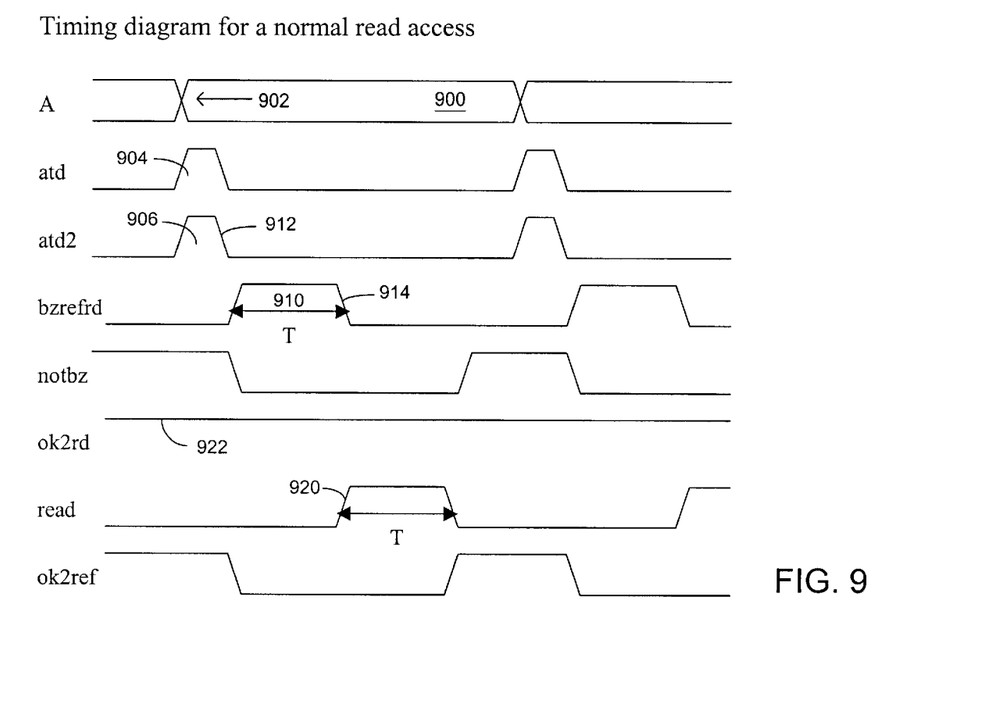
FIG. 9 is a timing diagram illustrating operation of the arbiter circuit of FIG. 8 for a normal READ access.

FIG. 8 is a schematic diagram illustrating one example of an implementation of the access arbiter (510 in FIG. 5). Each of the circuit components in FIG. 8 is well known, individually, so they will not be described in detail. One element that is presented in a symbolic form is the "falling edge triggered pulse generator," for example 810 and 820. This can be implemented in various ways which will be apparent to an electrical engineer. This circuit element outputs a high going pulse of a predetermined duration T in response to the falling edge at the input. The symbol T again is used to refer to the memory array access time. The circuitry of FIG. 8 is best understood by describing its operation with further reference to the timing diagram of FIG. 9. FIG. 9 is a timing diagram illustrating operation of the access arbiter for a normal read access. In FIG. 9, the address bus 900 exhibits a transition 902 to initiate a normal read access cycle. An address transition detector 802 detects the transition and asserts a pulse 904 on a signal atd. The signal atd2 presents address transitions that the memory array is allowed to see. (In other words, some address transitions will be hidden, or delayed, relative to the array.) Thus atd2 is a modified version of atd. The falling edge 906 of atd2 triggers a first falling edge triggered pulse generator ("FETPG") 810 which in turn generates a pulse (910 in FIG. 9) having a duration T, on the signal called "bzrefrd." The signal bzrefrd indicates the period of time a refresh preceding a read access can occur. This signal prevents the array from seeing an address transition. This signal will be used to effectively insert an extra access time slot T as described previously with respect to the normal read access cycle with reference to FIG. 2A. As appears in FIG. 2A, the array is prevented from seeing the address transition 202 until the beginning of the time slot 210.

Referring once again to FIG. 8, the external right control signal 526 and select control signal 524 are decoded to form a read mode signal 822 and a write mode signal 824. The atd2 signal provides a data input to flip flop 826 which in turn generates the "ok2rd" okay to read signal 828. Ok2rd indicates that the read address has not changed, thus allowing the read operation to proceed. The reader may recall that operation in the event of a premature address transition was discussed above (an invalid read operation) was discussed above with referenced to FIGS. 3A through 3C. The signal bzrefwt in FIG. 8 is a high going pulse subduration T indicating the period of time a refresh preceding a write can occur. This signal prevents the array from seeing an address transition. This implements the feature illustrated in FIG. 2B where a refresh time slot 236 is inserted at the beginning of a write access cycle before the array is access in time slot 238. And to complete definition of the signal names in FIG. 8, the signal notbz ("not busy") is asserted when neither bzrefrd nor bzrefwt nor read is high, indicating that the array is allowed to see the address transition. (The read signal 534 is not to be confused with the readmode signal 822.) Operation of the access arbiter in the various modes of interest is described next.

In the normal read mode, the timing diagram is shown in FIG. 9. Here, the signal W# is a logic 1, S# is a logic 0, "readmode" is a 1 and "writemode" is 0. A change in the address bus A of address bus 900 triggers the start of a read operation by asserting the atd pulse 904. The following R/S latch 806 generates "atd2" which again is the address transitions that are exposed to the array. In normal read mode, the array is allowed to see all address transitions. Therefore atd2 is nearly identical to atd in normal read mode.

At the falling edge 912 of atd2, a high going pulse of duration T, "bzrefrd" is generated. This is the period of time reserved for a refresh operation to complete. The following edge 914 of bzrefrd triggers the read pulse 920, as the gating signal ok2rd (828) is high during the normal read operation. This signal generally stays high in every normal read cycle, as indicated at 922, thus allowing refresh requests to be serviced as required.

Figure 10:
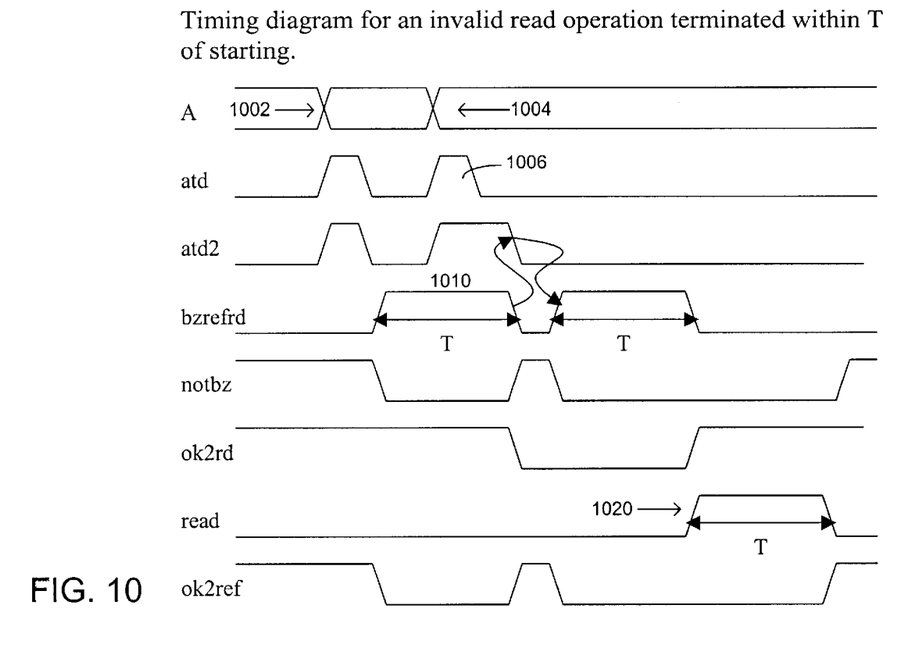
FIG. 10 is a timing diagram illustrating operation of the arbiter circuit of FIG. 8 for an invalid READ access terminated within a specified interval "T" of starting.

In one case of an invalid read, a second address transition terminates the read operation within a time T, i.e., before the read cycle time has elapsed. The first read becomes an invalid read. This situation is illustrated in the timing diagram of FIG. 10. In FIG. 10, a first address transition 1002 commences a read operation but a second address transition 1004 starts a new read operation before the first one has completed. The second address transition generates a second pulse 1006 on the atd signal. Because the second "atd" pulse overlaps with "bzrefrd," the array is not allowed to see a falling edge of atd2 until bzrefrd pulse is completed. The R/S latch (806 in FIG. 8) generates the desired atd2— the falling edge of the second pulse is stretched until the bzrefrd pulse is over, illustrated at 1010. This "stretched" atd2 ensures that the second bzrefrd pulse does not overlap the first. The overlap of atd and bzrefrd is detected by ok2rd which prevents the first "read" pulse from occurring. Consequently, the array will not see the first (invalid) read command. Rather, if the second read is a normal read operation, the read signal will be asserted as shown at 1020.

Figure 11:
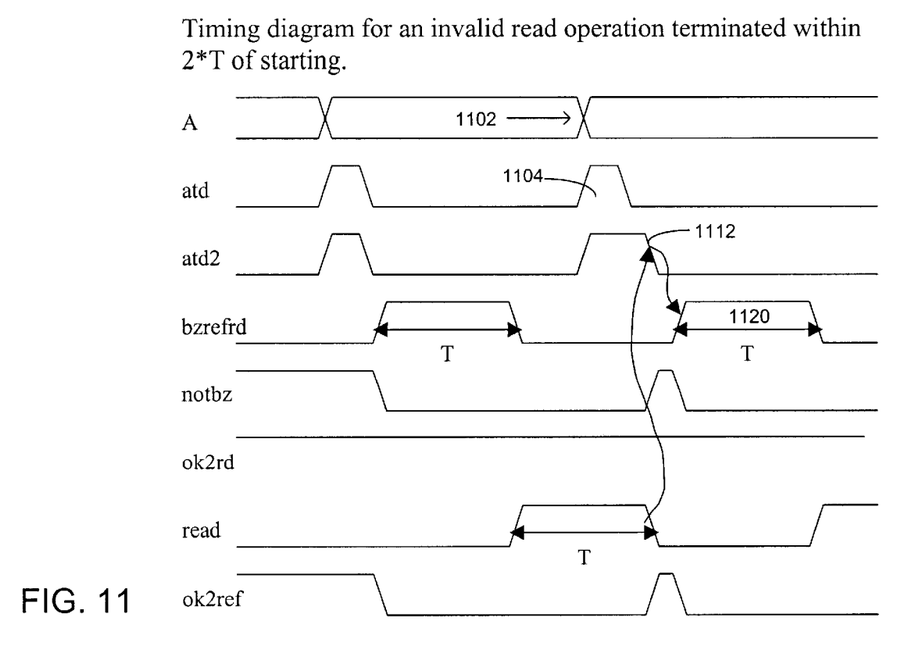
FIG. 11 is a timing diagram illustrating operation of the arbiter circuit of FIG. 8 for an invalid READ access terminated within 2*T of starting.

Next, we describe operation of the memory system, and especially the hidden refresh aspects, in the case where a read operation is terminated within 2*T of starting. Referring now to FIG. 11, the second address transition 1102 generates a second pulse 1104 on "atd." Because the second "atd" pulse overlaps with "read," the array is not allowed to see a falling edge of "atd2" until "read" pulse is over 1110. The R/S latch generates the desired "atd2"—the falling edge of the second pulse is delayed until the "read" pulse is over 1112. The stretched atd2 ensures that the second "bzrefrd" pulse 1120 does not overlap "read." If invalid reads occur repeatedly, "ok2ref" pulses high once every read cycle, allowing refresh requests to be serviced.

Figure 12:
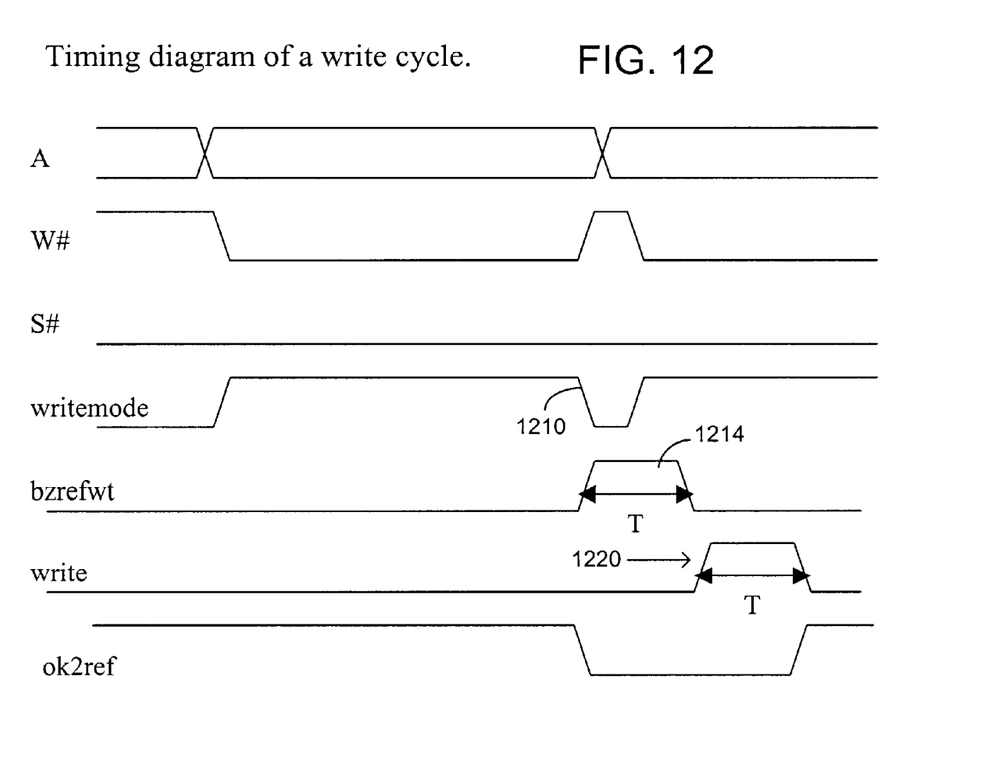
FIG. 12 is a timing diagram illustrating a write cycle in the memory system of the type illustrated in FIG. 5.

FIG. 12 is a timing diagram illustrating a write cycle. Asynchronous SRAM does not allow invalid write cycles. Therefore we consider only valid write cycles, where the write pulse width is at least the specified write cycle time. The timing diagram of FIG. 12 shows a W#-controlled write. The falling edge 1210 of "writemode" triggers a "bzrefwt" pulse 1214 of duration T. The falling edge of "bzrefwt" in turn triggers a "write" pulse 1220 of duration T. The internal signal "ok2ref" is high except during "bzrefwt" and "write" pulses. If write cycles occur repeatedly, "ok2ref" pulses high once every write cycle, allowing refresh requests to be serviced.

Figure 13:
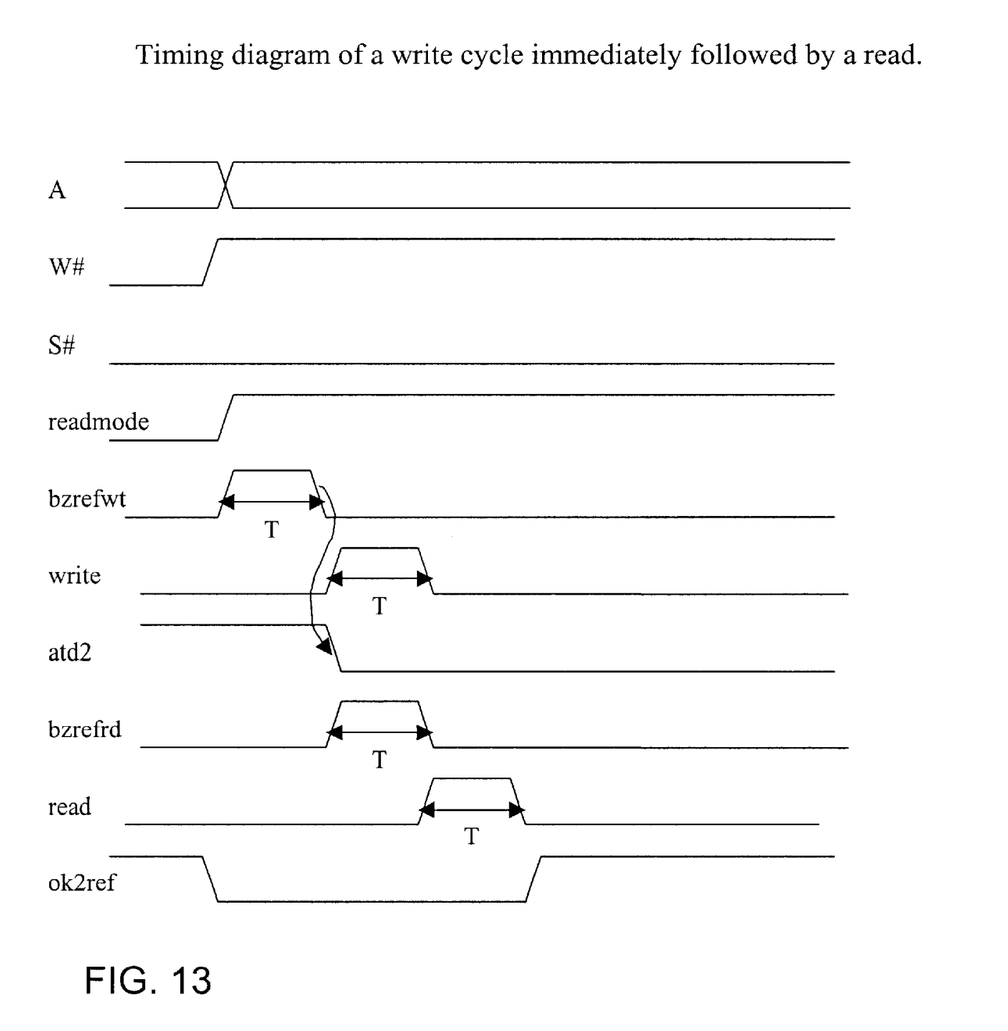
FIG. 13 is a timing diagram illustrating a write cycle immediately followed by a READ cycle in the memory system of the type illustrated in FIG. 5.

If a read cycle immediately follows a write cycle, as shown in the timing diagram of FIG. 13, the write occurs normally as described in the previous section. Internal signal "atd2" is held high during the write cycle. The falling edge of "bzrefwt" triggers a falling edge on "atd2." The read operation occurs normally afterwards. Further details will be apparent to the reader in view of the previous drawing figures and associated description.

One of ordinary skill in the art will appreciate that the specific circuitry shown, for example in FIGS. 5, 7A and 8, is merely provided to more fully describe the hidden refresh concept. The concept can be implemented in many different ways, using various types of circuitry, of which the circuits shown and described herein are merely one example.

It will be obvious to those having skill in the art that many changes may be made to the details of the above-described embodiment of this invention without departing from the underlying principles thereof. The scope of the present invention should, therefore, be determined only by the following claims.

What is claimed is:

1. A hidden refresh method of operating a DRAM array that implements external memory READ and WRITE access cycles, each READ access cycle comprising an array access period followed by a corresponding data out period, and each WRITE access cycle comprising a data in period followed by a corresponding array access period, the hidden refresh method comprising the steps of;

periodically generating a refresh request;

substantially immediately starting a refresh operation for at least one row of the DRAM array in response to the refresh request, unless a refresh start is currently prohibited;

prohibiting a refresh start during the array access portion of a READ access cycle but not during the data out period of the READ access cycle; and prohibiting a refresh start during the array access portion of a WRITE access cycle but not during the data in period of the WRITE access cycle;

thereby enabling refresh operations to complete within read and write cycles in an interleaved fashion without waiting until the DRAM array is idle.

2. A method according to claim 1 wherein one refresh operation consists of refreshing only one row of the DRAM array.

3. A method according to claim 1 and further comprising:

extending the array access period of a READ cycle by a predetermined first time slot having a duration selected so as to provide sufficient time for a pending refresh operation to complete; and deferring commencement of the READ cycle access to the array until after the first time slot, thereby ensuring time for the pending refresh operation to complete before the READ cycle access to the array begins.

4. A method according to claim 3 wherein the first time slot has a duration T of at least a predetermined access time of the DRAM array.

5. A method according to claim 4 and further comprising, responsive to said prohibiting a refresh start, queuing the pending refresh request until a refresh start is no longer prohibited; and then starting the queued refresh operation.

6. A method according to claim 1 and further comprising:

extending the array access period of a WRITE cycle by a predetermined second time slot having a duration selected so as to provide sufficient time to complete a pending refresh operation; and deferring commencement of the WRITE cycle access to the array until after the second time slot, thereby ensuring time for the pending refresh operation to complete before the WRITE cycle access to the array begins.

7. A method according to claim 6 wherein the second time slot has a length T of at least a predetermined access time of the DRAM array.

8. A method according to claim 7 and further comprising, responsive to said prohibiting a refresh start, queuing the pending refresh request until the refresh start is no longer prohibited; and then starting the queued refresh operation.

9. A method according to claim 1 and further comprising:

extending every READ access cycle by a first predetermined time slot to ensure that any pending refresh operation has time to complete;

extending every WRITE access cycle by a second predetermined time slot to ensure that any pending refresh operation has time to complete; and isolating the DRAM array from memory I/O structures so as to allow the data in or data out operations to overlap a refresh operation.

10. A high-density, low-power, semiconductor memory product comprising:

a DRAM memory array formed on a unitary semiconductor substrate, the DRAM memory array including a plurality of rows of memory cells, and a series of sense amps for reading and writing data to selected rows of the array;

a series of I/O structures coupled to the DRAM array to provide external access to the memory product;

a latch disposed between the DRAM array and the I/O structures for isolating the DRAM array from the I/O structures so as to support datain or dataout operations between the I/O structures and the latch concurrently during the DRAM array access portions of READ or WRITE access cycles; and a controller circuit for controlling access to the DRAM array, the controller circuit including an access arbiter circuit that prohibits the start of a refresh operation during an array access portion of a READ or WRITE access cycle.

11. A semiconductor memory product according to claim 10 and further comprising a refresh generator circuit that generates a substantially periodic refresh request signal.

12. A semiconductor memory product according to claim 11 wherein the refresh generator circuit includes a refresh address generator circuit that generates a series of row addresses, one at a time, for refreshing one row of the DRAM array in response to each refresh request signal.

13. A semiconductor memory product according to claim 11 wherein the controller circuit extends each READ access cycle and defers access to the DRAM array in order to ensure sufficient time for a pending refresh operation to complete before granting access to the DRAM array.

14. A semiconductor memory product according to claim 11 wherein the controller circuit extends each WRITE access cycle and defers access to the DRAM array in order to ensure sufficient time for a pending refresh operation to complete before granting access to the DRAM array.

15. A DRAM controller circuit for implementing a hidden refresh feature, the controller circuit comprising:

a refresh signal generator for generating periodic refresh request signals;

a refresh address generator for generating row addresses for refresh; and an access arbiter coupled to the refresh signal generator for inhibiting refresh request signals during the array access periods of a READ or a WRITE access cycle, wherein:

the access arbiter includes inputs for receiving an address bus (A), a chip select signal (S#) and a write signal (W#); and the controller circuit generates read, write and refresh signals for connection to a DRAM array to initiate read, write and refresh operations in the DRAM array, respectively.

16. A DRAM controller circuit for implementing a hidden refresh feature, the controller circuit comprising:

a refresh signal generator for generating periodic refresh request signals;

a refresh address generator for generating row addresses for refresh; and an access arbiter coupled to the refresh signal generator for inhibiting refresh request signals during the array access periods of a READ or a WRITE access cycle wherein:

the refresh signal generator includes an oscillator that generates an internal refresh clock signal having a period less than a predetermined maximum DRAM refresh interval;

and the refresh signal generator further includes a queue for queuing a refresh request in response to the refresh clock signal if refresh currently is inhibited by the access arbiter.

17. A DRAM controller circuit for implementing a hidden refresh feature, the controller circuit comprising:

a refresh signal generator for generating periodic refresh request signals;

a refresh address generator for generating row addresses for refresh; and an access arbiter coupled to the refresh signal generator for inhibiting refresh request signals during the array access periods of a READ or a WRITE access cycle; wherein the refresh address generator provides one row address at a time for refreshing one row of the DRAM array at a time, thereby minimizing the refresh cycle time; and the controller circuit implements a pin-compatible SRAM type of external interface and the controller circuit is integrated with at least one block of DRAM memory cells on a unitary semiconductor substrate.

* * * * *